(12) United States Patent
Wu et al.

(10) Patent No.: US 11,632,455 B2
(45) Date of Patent: Apr. 18, 2023

(54) PROXIMITY DETECTION SENSOR ARRANGEMENTS, DEVICES, AND METHODS

(71) Applicant: Analog Devices International Unlimited Company, Limerick (IE)

(72) Inventors: Xiangzhi Wu, Beijina (CN); Hsien-Chieh Liu, Taipei (TW)

(73) Assignee: Analog Devices International Unlimited Company, Limerick (IE)

( * ) Notice: Subject to any disclaimer, the term of this patent is extended or adjusted under 35 U.S.C. 154(b) by 331 days.

(21) Appl. No.: 16/828,381

(22) Filed: Mar. 24, 2020

(65) Prior Publication Data
US 2021/0281676 A1 Sep. 9, 2021

(30) Foreign Application Priority Data
Mar. 3, 2020 (CN) .................. PCTCN2020077623

(51) Int. Cl.
*H04M 1/72454* (2021.01)
*H03K 17/955* (2006.01)
(52) U.S. Cl.
CPC ...... *H04M 1/72454* (2021.01); *H03K 17/955* (2013.01); *H03K 2217/9607* (2013.01); *H04M 2250/12* (2013.01)
(58) Field of Classification Search
CPC .... H05K 2201/10151; H04M 1/72454; H04M 2250/12; H03K 17/955; H03K 2217/9607
See application file for complete search history.

(56) References Cited

U.S. PATENT DOCUMENTS

| | | | |
|---|---|---|---|
| 5,442,347 A | 8/1995 | Vranish | |
| 7,782,220 B2 | 8/2010 | Nakamura et al. | |
| 8,744,418 B2 | 6/2014 | Novet | |
| 9,582,111 B2 | 2/2017 | Rouaissia et al. | |
| 2009/0097689 A1* | 4/2009 | Prest | G16H 40/63 381/370 |
| 2016/0124573 A1* | 5/2016 | Rouaissia | H03K 17/955 345/174 |
| 2019/0155450 A1* | 5/2019 | Kim | G01L 1/26 |

OTHER PUBLICATIONS

ADUX1050, *Controller for Capacitive Proximity Sensors*, Analog Devices © 2015, 39 pages.

* cited by examiner

*Primary Examiner* — Justin Y Lee
(74) *Attorney, Agent, or Firm* — Akona IP PC (57) ABSTRACT

Disclosed herein are proximity detection sensor arrangements, as well as related methods and devices. In some embodiments, a sensor arrangement in an electronic device may include a first circuit layer including a proximity pad and a first reference pad, and a second circuit layer including a second reference pad and a temperature pad. The first circuit layer may be between the second circuit layer and a user-facing surface of the electronic device, the first reference pad may be electrically coupled to the second reference pad, and the first reference pad may be between the temperature pad and the user-facing surface.

20 Claims, 4 Drawing Sheets

PROXIMITY DETECTION SENSOR ARRANGEMENTS, DEVICES, AND METHODS

CROSS-REFERENCE TO PRIORITY APPLICATIONS

This application claims the benefit of and priority from PCT/CN2020/077623 filed Mar. 3, 2020, entitled, "PROXIMITY DETECTION SENSOR ARRANGEMENTS, DEVICES AND METHODS", incorporated herein by reference in its entirety.

BACKGROUND

Some personal electronic devices, such as smartphones, may incorporate sensors configured to detect the proximity of a user (and react by, for example, going from a "sleep" state to a "ready" state). Some such sensors are capacitive sensors, using capacitive coupling to detect changes in the dielectric constant of the material around the sensor.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example, not by way of limitation, in the figures of the accompanying drawings.

DETAILED DESCRIPTION

Disclosed herein are proximity detection sensor arrangements, as well as related methods and devices. In some embodiments, a sensor arrangement in an electronic device may include a first circuit layer including a proximity pad and a first reference pad, and a second circuit layer including a second reference pad and a temperature pad. The first circuit layer may be between the second circuit layer and a user-facing surface of the electronic device, the first reference pad may be electrically coupled to the second reference pad, and the first reference pad may be between the temperature pad and the user-facing surface.

In the following detailed description, reference is made to the accompanying drawings that form a part hereof wherein like numerals designate like parts throughout, and in which is shown, by way of illustration, embodiments that may be practiced. It is to be understood that other embodiments may be utilized, and structural or logical changes may be made, without departing from the scope of the present disclosure. Therefore, the following detailed description is not to be taken in a limiting sense.

Various operations may be described as multiple discrete actions or operations in turn, in a manner that is most helpful in understanding the claimed subject matter. However, the order of description should not be construed as to imply that these operations are necessarily order dependent. In particular, these operations may not be performed in the order of presentation. Operations described may be performed in a different order from the described embodiment. Various additional operations may be performed, and/or described operations may be omitted in additional embodiments.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B, and C). The phrase "A or B" means (A), (B), or (A and B). The drawings are not necessarily to scale. Although many of the drawings illustrate rectilinear structures with flat walls and right-angle corners, this is simply for ease of illustration, and actual devices made using these techniques will exhibit rounded corners, surface roughness, and other features.

The description uses the phrases "in an embodiment" or "in embodiments," which may each refer to one or more of the same or different embodiments. Furthermore, the terms "comprising," "including," "having," and the like, as used with respect to embodiments of the present disclosure, are synonymous. When used to describe a range of dimensions, the phrase "between X and Y" represents a range that includes X and Y. For convenience, the phrase "FIG. 4" may be used to refer to the collection of drawings of FIGS. 4A-4B, and the phrase "FIG. 5" may be used to refer to the collection of drawings of FIGS. 5A-5B.

Figure 1:
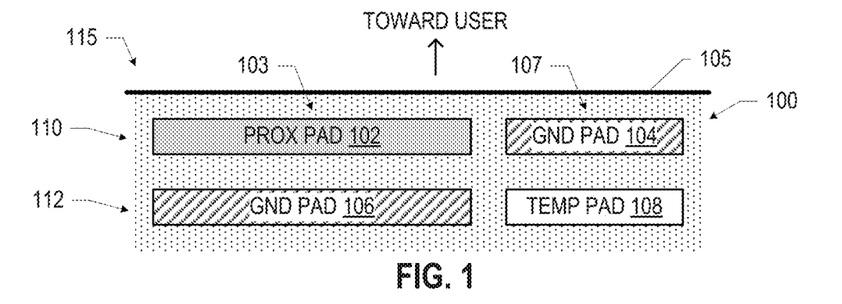
FIG. 1 is a side, cross-sectional view of a portion of an electronic device including a sensor arrangement, in accordance with various embodiments.

FIG. 1 is a side, cross-sectional view of a portion of an electronic device 115 including a sensor arrangement 100, in accordance with various embodiments. The electronic device 115 may be any suitable device, such as a wearable device or a handheld device. In some embodiments, the electronic device 115 may include a headphone or a pair of headphones (e.g., with or without a strap between the headphones), a pair of glasses, or a wristband, for example.

The sensor arrangement 100 may include proximity and temperature sensing capability to improve proximity detection performance in the electronic device 115 relative to conventional electronic devices. In particular, the sensor arrangement 100 may include a proximity sensor 103 and a temperature sensor 107. The proximity sensor 103 may include a proximity pad 102 and a reference pad 106, with the proximity pad 102 between the reference pad 106 and a user-facing surface 105 of the electronic device 115. The proximity sensor 103 may be a capacitive proximity sensor, with the proximity pad 102 and the reference pad 106 serving as capacitive plates; the instantaneous capacitance of the proximity sensor 103 may reflect the dielectric composition of the materials proximate to the proximity pad 102 (e.g., air and/or the body of a user), and thus changes in the instantaneous capacitance of the proximity sensor 103 may be used to detect whether a user is proximate to the electronic device 115 or not. In particular, as discussed below with reference to FIGS. 4 and 5, the instantaneous capacitance of the proximity sensor 103 may be compared to a proximity baseline, and deviations in the instantaneous capacitance of the proximity sensor 103 from the proximity baseline that exceed a threshold value may result in a determination that a user is or is no longer proximate to the electronic device 115.

As noted above, the sensor arrangement 100 may also include a temperature sensor 107. The temperature sensor 107 may include a temperature pad 108 and a reference pad 104. Like the proximity sensor 103, the temperature sensor 107 may also be a capacitor (with the temperature pad 108 and the reference pad 104 serving as capacitive plates), but the orientation of the temperature sensor 107 with reference to the user-facing surface 105 may be different than the orientation of the proximity sensor 103; namely, in the temperature sensor 107, the reference pad 104 may be between the temperature pad 108 and the user-facing surface 105. The reference pad 104 may thus act to "shield" the temperature pad 108 from changes in the dielectric composition proximate to the user-facing surface 105. In some embodiments, the reference pad 104 and the reference pad 106 may be electrically coupled together (e.g., shorted), and in some such embodiments, the reference pad 104 and the reference pad 106 may be coupled to ground of the electronic device 115.

In some embodiments, the elements of the sensor arrangement 100 may be distributed among different layers of a printed circuit (e.g., a flexible printed circuit). For example, in FIG. 1, the proximity pad 102 and the reference pad 104 may be included in a single, common printed circuit layer 110, while the reference pad 106 and the temperature pad 108 may be included in a different, common printed circuit layer 112. The printed circuit layer 110 may be between the printed circuit layer 112 and the user-facing surface 105, and in some embodiments, the print circuit layer 110 may be adjacent to the printed circuit layer 112 (allowing the sensor arrangement 100 to require only two layers of a printed circuit). Other distributions of the elements of the sensor arrangement 100 between printed circuit layers may be used; in some embodiments, the elements of the sensor arrangement 100 may be distributed across three or fewer printed circuit layers. In the printed circuit layers, the proximity pad 102, the reference pad 104, the reference pad 106, and the temperature pad 108 may each be implemented by regions of conductive material (e.g., copper or another metal) spaced apart from each other by one or more dielectric materials. The proximity pad 102, the reference pad 104, the reference pad 106, and the temperature pad 108 may have any desired shapes, a number of examples of which are discussed below with reference to FIGS. 4 and 5.

Figure 2:
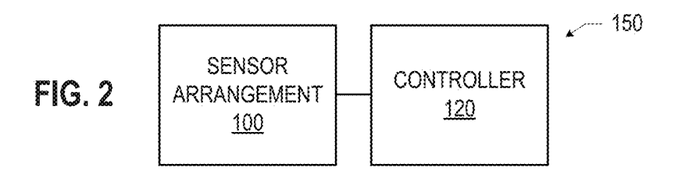
FIG. 2 is a block diagram of an example proximity detection system using the sensor arrangement of FIG. 1, in accordance with various embodiments.

The sensor arrangement 100 may be communicatively coupled to circuitry configured to measure and utilize the capacitance of the proximity sensor 103 and the temperature sensor 107 to determine whether a user is proximate to the electronic device 115. For example, FIG. 2 is a block diagram of an example proximity detection system 150 including the sensor arrangement 100 of FIG. 1 and a controller 120, in accordance with various embodiments. In some embodiments, the proximity detection system 150 may be included in the electronic device 115, while in other embodiments, the controller 120 may be separate from the electronic device 115 (e.g., in wireless communication with the electronic device 115).

To determine whether a user is proximate to the sensor arrangement 100, the controller 120 may receive the capacitance of the proximity sensor 103 (e.g., a signal output from the proximity sensor 103 representative of or related to the capacitance of the proximity sensor 103) and may compare that capacitance to a baseline value (stored, e.g., in a memory of the controller 120). If the capacitance of the proximity sensor 103 deviates from the proximity baseline value by an amount greater than a threshold, a determination that the user is or is not proximate to the sensor arrangement 100 may be made. For example, if the capacitance of the proximity sensor 103 is greater than the proximity baseline value by an amount greater than a "high" threshold, the controller 120 may determine (e.g., generate an indicator) that the user is proximate to the sensor arrangement 100. If the capacitance of the proximity sensor 103 is less than the proximity baseline value by an amount greater than a "low" threshold, the controller 120 may determine (e.g., generate an indicator) that the user is not proximate to the sensor arrangement 100. This particular example is simply illustrative, and the controller 120 may implement any desired threshold analysis (e.g., including hysteresis thresholds, etc.) or other analysis.

During use of the electronic device 115, changes in the temperature of the sensor arrangement 100 may affect the instantaneous capacitance of the proximity sensor 103. For example, when a user is proximate to the user-facing surface 105 of the electronic device 115, body heat from the user may increase the temperature of the sensor arrangement 100 and may result in an increase in the capacitance of the proximity sensor 103. When the user then moves away from the user-facing surface 105 (e.g., when the electronic device 115 includes a headphone, and the user removes the headphone), this change in local dielectric composition may result in a decrease of the capacitance of the proximity sensor 103, but this decrease may be less than the increase in capacitance caused by the increase in temperature of the sensor arrangement 100. Subsequent cooling of the sensor arrangement 100, and a resultant decrease in the capacitance of the proximity sensor 103, may occur relatively slowly. Thus, without addressing the effects of temperature, the controller 120 might "miss" a user being no longer in proximity to the electronic device 115 (e.g., removing a headphone) until the sensor arrangement 100 has sufficiently cooled.

In the sensor arrangement 100, the orientation of the temperature sensor 107 (with the reference pad 104 between the temperature pad 108 and the user-facing surface 105) may mean that the capacitance of the temperature sensor 107 may be relatively less sensitive to the dielectric composition at the user-facing surface 105 as compared to the proximity sensor 103, and thus that the capacitance of the temperature sensor 107 may be relatively agnostic to the proximity of a user. However, the temperature sensor 107 may be in the same temperature environment as the proximity sensor 103, and thus may experience analogous changes in capacitance as a function of the temperature of the sensor arrangement 100. Consequently, the controller 120 may utilize the capacitance of the temperature sensor 107 (e.g., a signal output from the temperature sensor 107 representative of or related to the capacitance of the temperature sensor 107) as an indicator of the temperature of the sensor arrangement 100 in order to compensate for temperature-related effects on the capacitance of the proximity sensor 103.

Figure 3A:
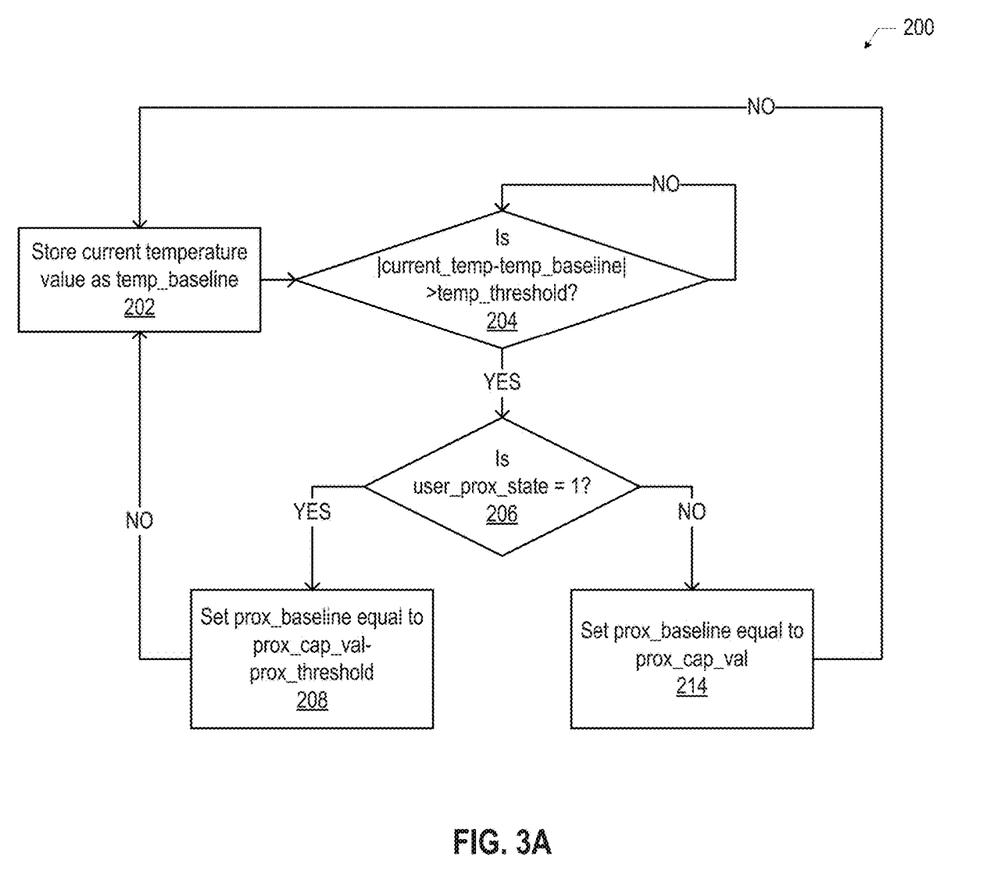
FIGS. 3A and 3B are flow diagrams of methods of baseline updating and proximity detection, in accordance with various embodiments.
Figure 3B:
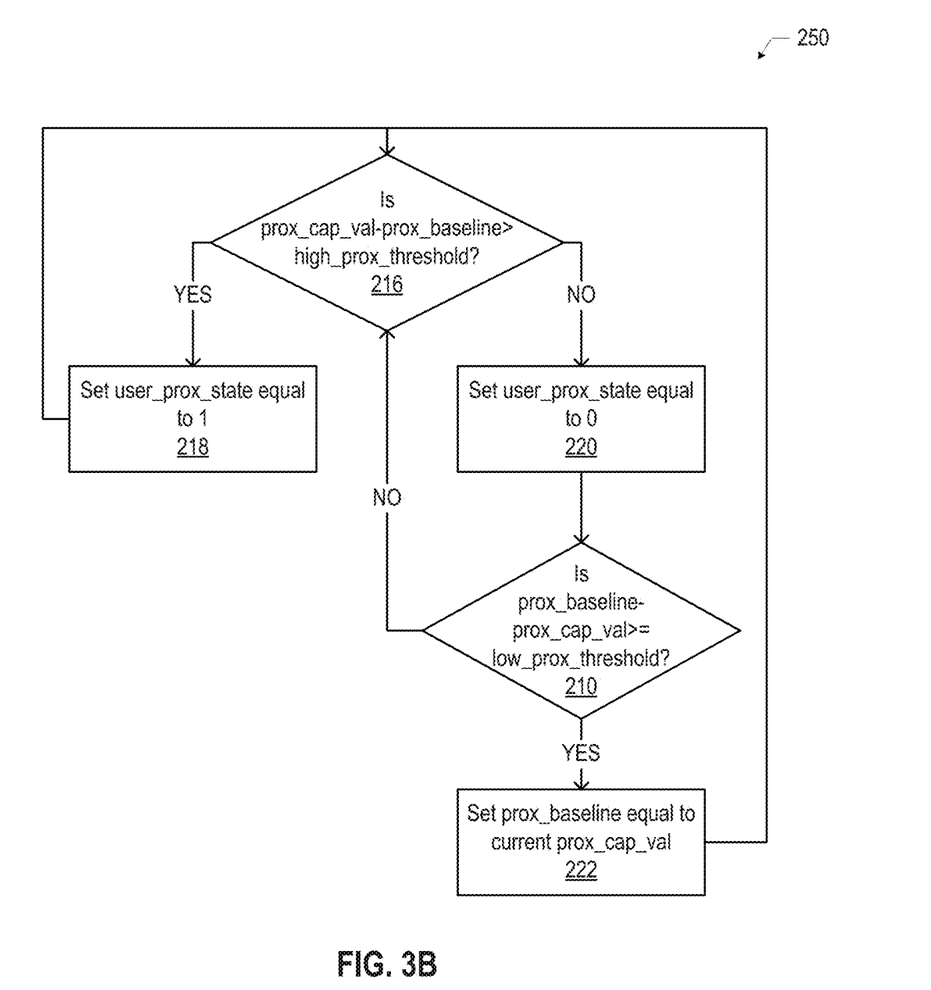

The controller 120 may utilize data from the temperature sensor 107 in any of a number of ways in order to improve the ability of the controller 120 to accurately detect the proximity of the user. For example, in some embodiments, changes in the output of the temperature sensor 107 may be used to trigger an adjustment of the proximity baseline used in a proximity detection threshold analysis. FIGS. 3A and 3B are flow diagrams of methods 200 and 250 that may be implemented by the controller 120 for proximity detection. Although the operations of the methods 200 and 250 may be illustrated with reference to particular embodiments of the sensor arrangements 100 disclosed herein, the methods 200 and 250 may be used with any suitable sensor arrangements. Operations are illustrated once each and in a particular order in FIGS. 3A and 3B, but the operations may be reordered and/or repeated as desired. In some embodiments, the controller 120 may perform the methods 200 and 250 in parallel.

Starting with the method 200 of FIG. 3A, at 202, a current temperature value may be stored as a baseline temperature value. For example, the controller 120 may store a reading of the capacitance of the temperature sensor 107 as the baseline temperature value.

At 204, it may be determined whether a current temperature value (which may have changed since 202) deviates from the baseline temperature value by an amount greater than a temperature threshold. For example, the controller 120 may receive an updated reading of the capacitance of the temperature sensor 107, and may compare it to the baseline temperature value to determine whether the difference exceeds an associated threshold. The temperature threshold used at 204 may be an absolute amount (e.g., corresponding to a particular fixed number of degrees of temperature) or a percentage amount, for example. Further, use of the singular phrase "temperature threshold" is simply for economy of illustration, and the comparison performed at 204 may include multiple thresholds (e.g., a "high" threshold for temperature increases above the baseline temperature value and a different "low" threshold for temperature decreases below the baseline temperature value). If it is determined at 204 that the current temperature does not deviate from the baseline temperature value by an amount greater than the temperature threshold, the method may return to 204 and may repeat the comparison with a new current temperature value. In some embodiments, this checking of the current temperature value may occur on a periodic basis with a configurable period (e.g., with less frequent checking when lower power consumption is desired).

If it is determined at 204 that the current temperature deviates from the baseline temperature value by an amount greater than the temperature threshold, the method 200 may proceed to 206, at which it may be determined whether a user proximity state indicates that a user was previously determined to be proximate (e.g., the value of a state variable user_prox_state is equal to 1) or the user was previously determined to not be proximate (e.g., the value of the state variable user_prox_state is equal to 0). For example, the controller 120 may read a state variable or other stored indicator in memory to determine whether a user was determined to be proximate to the sensor arrangement 100 or not in a most recent assessment.

If it is determined at 206 that a user was previously determined to be proximate, the method 200 may proceed to 208 at which the proximity baseline may be set equal to the current proximity sensor capacitance value minus the proximity sensor capacitance threshold used to determine whether a user is proximate or not. For example, the controller 120 may receive a reading of the capacitance of the proximity sensor 103, and may subtract from that reading a predetermined proximity sensor capacitance threshold in order to generate a new baseline for further analysis. The predetermined proximity sensor capacitance threshold may be stored in a memory of the controller 120, and may be determined empirically during calibration of the system 150. The method 200 may then proceed to 202 and may begin again.

Returning to 206, if it is determined at 206 the user was previously determined not to be proximate, the method 200 may proceed to 214 at which the proximity baseline may be set equal to the current proximity sensor capacitance value. For example, the controller 120 may receive a reading of the capacitance of the proximity sensor 103, and may save that reading as the new baseline for further analysis. The method 200 may then proceed to 202 and may begin again.

Turning to the method 250 of FIG. 3B, at 216, it may be determined whether the current proximity sensor capacitance value, minus the proximity baseline (set via the method 200 of FIG. 3A), is greater than a higher proximity sensor capacitance threshold. For example, the controller 120 may receive a reading of the capacitance of the proximity sensor 103, and may subtract from that reading the proximity baseline generated by the method 200 of FIG. 3A; the controller 120 may then determine whether the resulting value is greater than a higher proximity sensor capacitance threshold (used to avoid rapid changes in detection state due to random fluctuations). The higher proximity sensor capacitance threshold may be stored in the memory of the controller 120, and may be determined empirically during calibration of the system 150.

If it is determined at 216 that the current proximity sensor capacitance value minus the proximity baseline is greater than a higher proximity sensor capacitance threshold, the method 250 may proceed to 218 and the user proximity state may reflect that the user is determined to be proximate (e.g., the controller 120 may change the value of the state variable user_prox_state to 1). The method 250 may then return to 218 and may begin again.

If it is determined at 216 that the current proximity sensor capacitance value minus the proximity baseline is not greater than a higher proximity sensor capacitance threshold, the method 250 may proceed to 220 and the user proximity state may reflect that the user is determined not to be proximate (e.g., the controller 120 may change the value of the state variable user_prox_state to 0).

The method 250 may then proceed to 210 at which it may be determined whether the proximity baseline (set via the method 200 of FIG. 3A) minus the current proximity sensor capacitance value is greater than or equal to a lower proximity sensor capacitance threshold. For example, the controller 120 may receive a reading of the capacitance of the proximity sensor 103, and may subtract that reading from the proximity baseline; the controller 120 may then determine whether the resulting value is greater than or equal to a lower proximity sensor capacitance threshold (used to avoid rapid changes in detection state due to random fluctuations). The lower proximity sensor capacitance threshold may be stored in the memory of the controller 120, and may be determined empirically during calibration of the system 150.

If it is determined at 210 that the proximity baseline minus the current proximity sensor capacitance value is not greater than or equal to a lower proximity sensor capacitance threshold, the method 250 may proceed to 216 and may begin again. If it is determined at 210 that the proximity baseline minus the current proximity sensor capacitance value is greater than or equal to a lower proximity sensor capacitance threshold, the method 250 may proceed to 222 and the proximity baseline may be updated to be equal to the current proximity sensor capacitance value. The method 250 may then proceed to 216 and may begin again.

The method 200 may then proceed to 216 at which it may be determined whether the current proximity sensor capacitance value (which may have changed since 214), minus the proximity baseline (determined at 214), is greater than a higher proximity sensor capacitance threshold. For example, the controller 120 may receive a reading of the capacitance of the proximity sensor 103, and may subtract from that reading the proximity baseline generated at 214; the controller 120 may then determine whether the resulting value is greater than a higher proximity sensor capacitance threshold (used to avoid rapid changes in detection state due to random fluctuations). The higher proximity sensor capacitance threshold may be stored in the memory of the controller 120, and may be determined empirically during calibration of the system 150.

Figure 4A:
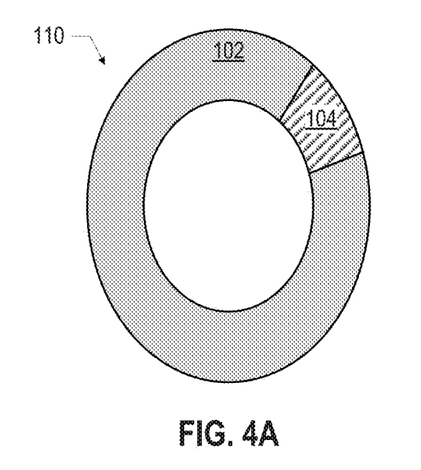
FIGS. 4A and 4B are top views of the layers in an example of the sensor arrangement of FIG. 1, in accordance with various embodiments.
Figure 4B:
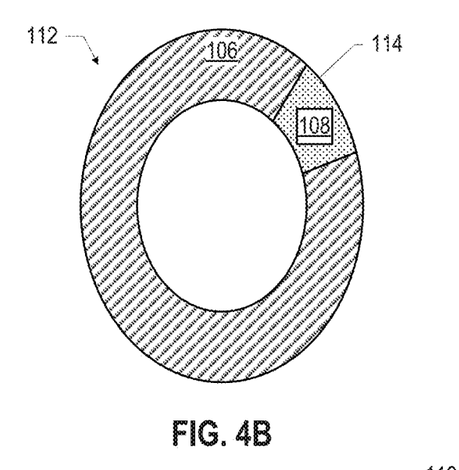

As noted above, the proximity pad 102, the reference pad 104, the reference pad 106, and the temperature pad 108 in a sensor arrangement 100 may have any desired shapes. For example, FIGS. 4A and 4B are top views of the printed circuit layers 110 and 112, respectively, in an example of the sensor arrangement 100 of FIG. 1, in accordance with various embodiments. In the embodiment of FIG. 4, the sensor arrangement 100 has a footprint shaped like a oval ring; such an embodiment may be particularly suited for use in a headphone (e.g., where the ring-shaped footprint may be sized to match an ear) or in a pair of glasses (e.g., where the ring-shaped footprint may be sized to match the area around an eye). The proximity pad 102 may occupy much of the oval ring footprint in the printed circuit layer 110, with the reference pad 104 shaped as a wedge between portions of the proximity pad 102. In the printed circuit layer 112, the reference pad 106 may occupy much of the oval ring footprint, with a dielectric material 114 largely shaped as a wedge between portions of the reference pad 106, and the temperature pad 108 disposed within the wedge of the dielectric material 114. The temperature pad 108 may be entirely within the shadow of the reference pad 104. In the drawings of FIGS. 4 and 5, conductive elements sharing a printed circuit layer may be isolated from each other by at least a small amount of intervening dielectric material (e.g., so as not to short the proximity pad 102 and the reference pad 104), as appropriate.

Figure 5A:
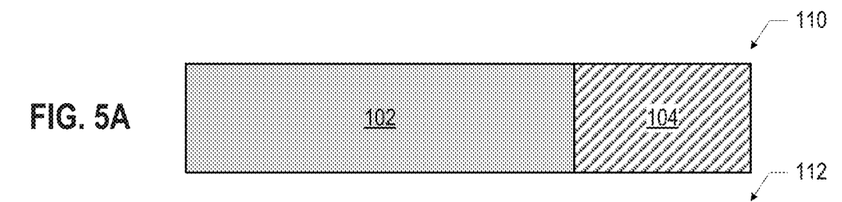
FIGS. 5A and 5B are top views of the layers in another example of the sensor arrangement of FIG. 1, in accordance with various embodiments.
Figure 5B:
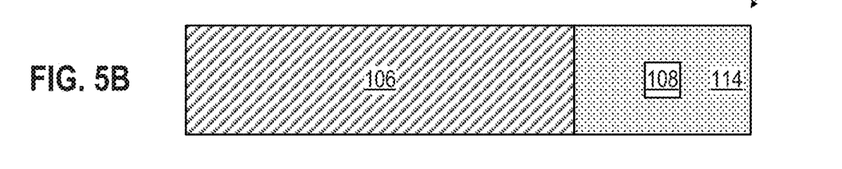

FIGS. 5A and 5B are top views of the printed circuit layers 110 and 112, respectively, in another example of the sensor arrangement 100 of FIG. 1, in accordance with various embodiments. In the embodiment of FIG. 5, the sensor arrangement 100 has a footprint that is largely rectangular; such an embodiment may be particularly suited for use in a wristband, a chest strap, a patch, or a garment. In the printed circuit layer 110, the proximity pad may occupy much of the rectangular footprint, and may have a rectangular shape itself, while the reference pad 104 may have a smaller rectangular shape. In the printed circuit layer 112, the reference pad 106 may occupy much of the rectangular footprint, and may be next to a rectangular portion of dielectric material 114; the temperature pad 108 may be disposed within the rectangle of the dielectric material 114. As in the embodiment of FIG. 4, the temperature pad 108 of FIG. 5 may be entirely within the shadow of the reference pad 104.

Figure 6:
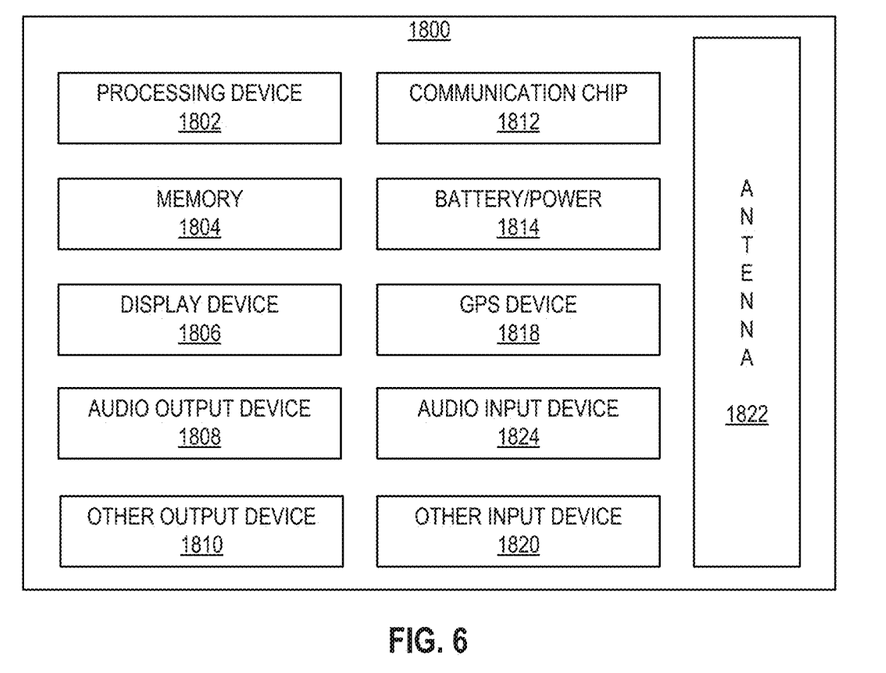
FIG. 6 is a block diagram of an example electronic device that may include a sensor arrangement and/or may perform a proximity detection method in accordance with any of the embodiments disclosed herein.

The sensor arrangements 100 disclosed herein may be included in any suitable electronic component. For example, FIG. 6 is a block diagram of an example electronic device 1800 that may a sensor arrangement and/or may perform a proximity detection method in accordance with any of the embodiments disclosed herein. A number of components are illustrated in FIG. 6 as included in the electronic device 1800, but any one or more of these components may be omitted or duplicated, as suitable for the application. In some embodiments, some or all of the components included in the electronic device 1800 may be attached to one or more motherboards. In some embodiments, some or all of these components are fabricated onto a single system-on-a-chip (SoC) die.

Additionally, in various embodiments, the electronic device 1800 may not include one or more of the components illustrated in FIG. 6, but the electronic device 1800 may include interface circuitry for coupling to the one or more components. For example, the electronic device 1800 may not include a display device 1806, but may include display device interface circuitry (e.g., a connector and driver circuitry) to which a display device 1806 may be coupled. In another set of examples, the electronic device 1800 may not include an audio input device 1824 or an audio output device 1808, but may include audio input or output device interface circuitry (e.g., connectors and supporting circuitry) to which an audio input device 1824 or audio output device 1808 may be coupled.

The electronic device 1800 may include a processing device 1802 (e.g., one or more processing devices). As used herein, the term "processing device" or "processor" may refer to any device or portion of a device that processes electronic data from registers and/or memory to transform that electronic data into other electronic data that may be stored in registers and/or memory. In some embodiments, the processing device 1802 may be configured to perform some or all of the proximity detection methods disclosed herein. The processing device 1802 may include one or more digital signal processors (DSPs), application-specific integrated circuits (ASICs), central processing units (CPUs), graphics processing units (GPUs), cryptoprocessors (specialized processors that execute cryptographic algorithms within hardware), server processors, or any other suitable processing devices. The electronic device 1800 may include a memory 1804, which may itself include one or more memory devices such as volatile memory (e.g., dynamic random access memory (DRAM)), nonvolatile memory (e.g., read-only memory (ROM)), flash memory, solid state memory, and/or a hard drive. In some embodiments, the memory 1804 may include memory that shares a die with the processing device 1802. This memory may be used as cache memory and may include embedded dynamic random access memory (eDRAM) or spin transfer torque magnetic random access memory (STT-MRAM).

In some embodiments, the electronic device 1800 may include a communication chip 1812 (e.g., one or more communication chips). For example, the communication chip 1812 may be configured for managing wireless communications for the transfer of data to and from the electronic device 1800. The term "wireless" and its derivatives may be used to describe circuits, devices, systems, methods, techniques, communications channels, etc., that may communicate data through the use of modulated electromagnetic radiation through a nonsolid medium. The term does not imply that the associated devices do not contain any wires, although in some embodiments they might not.

The communication chip 1812 may implement any of a number of wireless standards or protocols, including but not limited to Institute for Electrical and Electronic Engineers (IEEE) standards including Wi-Fi (IEEE 802.11 family), IEEE 802.16 standards (e.g., IEEE 802.16-2005 Amendment), Long-Term Evolution (LTE) project along with any amendments, updates, and/or revisions (e.g., advanced LTE project, ultra mobile broadband (UMB) project (also referred to as "3GPP2"), etc.). IEEE 802.16 compatible Broadband Wireless Access (BWA) networks are generally referred to as WiMAX networks, an acronym that stands for Worldwide Interoperability for Microwave Access, which is a certification mark for products that pass conformity and interoperability tests for the IEEE 802.16 standards. The communication chip 1812 may operate in accordance with a Global System for Mobile Communication (GSM), General Packet Radio Service (GPRS), Universal Mobile Telecommunications System (UMTS), High Speed Packet Access (HSPA), Evolved HSPA (E-HSPA), or LTE network. The communication chip 1812 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication chip 1812 may operate in accordance with Code Division Multiple Access (CDMA), Time Division Multiple Access (TDMA), Digital Enhanced Cordless Telecommunications (DECT), Evolution-Data Optimized (EV-DO), and derivatives thereof, as well as any other wireless protocols that are designated as 3G, 4G, 5G, and beyond. The communication chip 1812 may operate in accordance with other wireless protocols in other embodiments. The electronic device 1800 may include an antenna 1822 to facilitate wireless communications and/or to receive other wireless communications (such as AM or FM radio transmissions).

In some embodiments, the communication chip 1812 may manage wired communications, such as electrical, optical, or any other suitable communication protocols (e.g., the Ethernet). As noted above, the communication chip 1812 may include multiple communication chips. For instance, a first communication chip 1812 may be dedicated to shorter-range wireless communications such as Wi-Fi or Bluetooth, and a second communication chip 1812 may be dedicated to longer-range wireless communications such as global positioning system (GPS), EDGE, GPRS, CDMA, WiMAX, LTE, EV-DO, or others. In some embodiments, a first communication chip 1812 may be dedicated to wireless communications, and a second communication chip 1812 may be dedicated to wired communications.

The electronic device 1800 may include battery/power circuitry 1814. The battery/power circuitry 1814 may include one or more energy storage devices (e.g., batteries or capacitors) and/or circuitry for coupling components of the electronic device 1800 to an energy source separate from the electronic device 1800 (e.g., AC line power).

The electronic device 1800 may include a display device 1806 (or corresponding interface circuitry, as discussed above). The display device 1806 may include any visual indicators, such as a heads-up display, a computer monitor, a projector, a touchscreen display, a liquid crystal display (LCD), a light-emitting diode display, or a flat panel display.

The electronic device 1800 may include an audio output device 1808 (or corresponding interface circuitry, as discussed above). The audio output device 1808 may include any device that generates an audible indicator, such as speakers, headsets, or earbuds.

The electronic device 1800 may include an audio input device 1824 (or corresponding interface circuitry, as discussed above). The audio input device 1824 may include any device that generates a signal representative of a sound, such as microphones, microphone arrays, or digital instruments (e.g., instruments having a musical instrument digital interface (MIDI) output).

The electronic device 1800 may include a GPS device 1818 (or corresponding interface circuitry, as discussed above). The GPS device 1818 may be in communication with a satellite-based system and may receive a location of the electronic device 1800, as known in the art.

The electronic device 1800 may include an other output device 1810 (or corresponding interface circuitry, as discussed above). Examples of the other output device 1810 may include an audio codec, a video codec, a printer, a wired or wireless transmitter for providing information to other devices, or an additional storage device.

The electronic device 1800 may include an other input device 1820 (or corresponding interface circuitry, as discussed above). Examples of the other input device 1820 may include an accelerometer, a gyroscope, a compass, an image capture device, a keyboard, a cursor control device such as a mouse, a stylus, a touchpad, a bar code reader, a Quick Response (QR) code reader, any sensor, or a radio frequency identification (RFID) reader. In some embodiments, the other input device 1820 may include any of the sensor arrangements 100 disclosed herein.

The electronic device 1800 may have any desired form factor, such as a handheld or mobile electronic device (e.g., a cell phone, a smart phone, a mobile internet device, a music player, a tablet computer, a laptop computer, a netbook computer, an ultrabook computer, a personal digital assistant (PDA), an ultra mobile personal computer, etc.), a desktop electronic device, a server device or other networked computing component, a printer, a scanner, a monitor, a set-top box, an entertainment control unit, a vehicle control unit, a digital camera, a digital video recorder, or a wearable electronic device. In some embodiments, the electronic device 1800 may be any other electronic device that processes data.

The following paragraphs provide various examples of the embodiments disclosed herein.

Example 1 is an electronic device, including a sensor arrangement, including: a first circuit layer including a proximity pad and a first reference pad, and a second circuit layer including a second reference pad and a temperature pad, wherein the first circuit layer is between the second circuit layer and a user-facing surface of the electronic device, the first reference pad is electrically coupled to the second reference pad, and the first reference pad is between the temperature pad and the user-facing surface.

Example 2 includes the subject matter of Example 1, and further specifies that the first reference pad and the second reference pad are electrically coupled to ground.

Example 3 includes the subject matter of any of Examples 1-2, and further specifies that the electronic device is a wearable electronic device.

Example 4 includes the subject matter of any of Examples 1-3, and further specifies that the electronic device includes a headphone, and the sensor arrangement is included in the headphone.

Example 5 includes the subject matter of any of Examples 1-4, and further specifies that the first circuit layer and the second circuit layer are flexible printed circuit layers.

Example 6 includes the subject matter of any of Examples 1-5, and further specifies that the sensor arrangement includes a flexible printed circuit.

Example 7 includes the subject matter of any of Examples 1-6, and further specifies that the proximity pad and the second reference pad together are part of a capacitive proximity sensor.

Example 8 includes the subject matter of any of Examples 1-7, and further includes:
a controller electrically coupled to the sensor arrangement.

Example 9 includes the subject matter of Example 8, and further specifies that the controller is to generate a signal indicative of whether a user is in proximity to the electronic device or not based on signals generated by the sensor arrangement.

Example 10 includes the subject matter of any of Examples 8-9, and further specifies that the sensor arrangement is to generate a proximity capacitance value using the proximity pad, and the sensor arrangement is to generate a temperature capacitance value using the temperature pad.

Example 11 includes the subject matter of Example 10, and further specifies that the controller is to, based on the temperature capacitance value, adjust a baseline proximity capacitance value used to determine whether a user is in proximity to the electronic device or not.

Example 12 includes the subject matter of Example 11, and further specifies that adjusting the baseline proximity capacitance value based on the temperature capacitance value includes adjusting the baseline proximity capacitance value in response to changes in the temperature capacitance value.

Example 13 includes the subject matter of any of Examples 11-12, and further specifies that adjusting the baseline proximity capacitance value includes, when a user is indicated as being in proximity to the electronic device, set the baseline proximity capacitance value equal to the proximity capacitance value minus a proximity capacitance threshold.

Example 14 includes the subject matter of Example 13, and further specifies that adjusting the baseline proximity capacitance value includes, when a user is indicated as not being in proximity to the electronic device, set the baseline proximity capacitance value equal to the proximity capacitance value.

Example 15 is an electronic device, including a sensor arrangement, including: a proximity pad, a first reference pad, a second reference pad, and a temperature pad, wherein the proximity pad is between a user-facing surface of the electronic device and the second reference pad, the first reference pad is between the user-facing surface and the temperature pad, and wherein the sensor arrangement is included in fewer than four circuit layers.

Example 16 includes the subject matter of Example 15, and further specifies that the proximity pad and the first reference pad are included in a single circuit layer.

Example 17 includes the subject matter of any of Examples 15-16, and further specifies that the second reference pad and the temperature pad are included in a single circuit layer.

Example 18 includes the subject matter of any of Examples 15-17, and further specifies that the first reference pad and the second reference pad are electrically coupled.

Example 19 includes the subject matter of any of Examples 15-18, and further specifies that the first reference pad and the second reference pad are electrically coupled to ground.

Example 20 includes the subject matter of any of Examples 15-19, and further specifies that the electronic device is a wearable electronic device.

Example 21 includes the subject matter of any of Examples 15-20, and further specifies that the electronic device includes a headphone, and the sensor arrangement is included in the headphone.

Example 22 includes the subject matter of any of Examples 15-20, and further specifies that the sensor arrangement includes a flexible printed circuit.

Example 23 includes the subject matter of any of Examples 15-22, and further specifies that the proximity pad and the second reference pad together are part of a capacitive proximity sensor.

Example 24 includes the subject matter of any of Examples 15-23, and further includes:
a controller electrically coupled to the sensor arrangement.

Example 25 includes the subject matter of Example 24, and further specifies that the controller is to generate a signal indicative of whether a user is in proximity to the electronic device or not based on signals generated by the sensor arrangement.

Example 26 includes the subject matter of any of Examples 24-25, and further specifies that the sensor arrangement is to generate a proximity capacitance value using the proximity pad, and the sensor arrangement is to generate a temperature capacitance value using the temperature pad.

Example 27 includes the subject matter of Example 26, and further specifies that the controller is to, based on the temperature capacitance value, adjust a baseline proximity capacitance value used to determine whether a user is in proximity to the electronic device or not.

Example 28 includes the subject matter of Example 27, and further specifies that adjusting the baseline proximity capacitance value based on the temperature capacitance value includes adjusting the baseline proximity capacitance value in response to changes in the temperature capacitance value.

Example 29 includes the subject matter of any of Examples 27-28, and further specifies that adjusting the baseline proximity capacitance value includes, when a user is indicated as being in proximity to the electronic device, set the baseline proximity capacitance value equal to the proximity capacitance value minus a proximity capacitance threshold.

Example 30 includes the subject matter of Example 29, and further specifies that adjusting the baseline proximity capacitance value includes, when a user is indicated as not being in proximity to the electronic device, set the baseline proximity capacitance value equal to the proximity capacitance value.

Example 31 is a method of proximity detection for an electronic device, including: adjusting a baseline proximity capacitance value based at least in part on temperature data; and determining whether a user is in proximity to the electronic device, wherein determining whether the user is in proximity to the electronic device includes performing a threshold comparison based at least in part on a proximity capacitance value and the baseline proximity capacitance value.

Example 32 includes the subject matter of Example 31, and further specifies that adjusting the baseline proximity capacitance value based at least in part on temperature data includes: identifying a temperature change; and in response to identifying the temperature change, adjusting the baseline proximity capacitance value.

Example 33 includes the subject matter of any of Examples 31-32, and further specifies that adjusting the baseline proximity capacitance value is based at least in part on an indicator of whether a user is currently in proximity to the electronic device.

Example 34 includes the subject matter of Example 33, and further specifies that adjusting the baseline proximity capacitance value includes: when the indicator indicates that a user is currently in proximity to the electronic device, setting the baseline proximity capacitance value equal to the proximity capacitance value minus a proximity capacitance threshold.

Example 35 includes the subject matter of any of Examples 33-34, and further specifies that adjusting the baseline proximity capacitance value includes: when the indicator indicates that a user is not currently in proximity to the electronic device, setting the baseline proximity capacitance value equal to the proximity capacitance value.

The invention claimed is:

1. An electronic device, comprising:
   a sensor arrangement, including:
      a first circuit layer including a proximity pad and a first reference pad, and
      a second circuit layer including a second reference pad and a temperature pad, wherein:
      the first circuit layer is between the second circuit layer and a user-facing surface of the electronic device, the first reference pad is electrically coupled to the second reference pad, and the first reference pad is between the temperature pad and the user-facing surface;
   the sensor arrangement, having the first circuit layer and the second circuit layer stacked, has a top-view footprint shaped like an oval ring;
   the proximity pad occupy much of the oval ring footprint, and the first reference pad shaped as a wedge between portions of the proximity pad; and
   the second reference pad occupy much of the oval ring footprint, and the temperature pad is disposed within a shadow of the first reference pad.

2. The electronic device of claim 1, wherein the first reference pad and the second reference pad are electrically coupled to ground.

3. The electronic device of claim 1, wherein the electronic device is a wearable electronic device.

4. The electronic device of claim 1, wherein the electronic device includes a headphone, and the sensor arrangement is included in the headphone.

5. The electronic device of claim 1, wherein the first circuit layer and the second circuit layer are flexible printed circuit layers.

6. The electronic device of claim 1, wherein the sensor arrangement includes a flexible printed circuit.

7. The electronic device of claim 1, wherein the proximity pad and the second reference pad together are part of a capacitive proximity sensor.

8. An electronic device, comprising:
   a sensor arrangement, including:
      a proximity pad,
      a first reference pad,
      a second reference pad, and
      a temperature pad, and
   a controller electrically coupled to the sensor arrangement;
   wherein:
      the proximity pad is between a user-facing surface of the electronic device and the second reference pad, the first reference pad is between the user-facing surface and the temperature pad, and wherein the sensor arrangement is included in fewer than four circuit layers;
      the sensor arrangement is to generate a proximity capacitance value using the proximity pad, and the sensor arrangement is to generate a temperature capacitance value using the temperature pad;
      the controller is to, based on the temperature capacitance value, adjust a baseline proximity capacitance value used to determine whether a user is in proximity to the electronic device or not; and
      adjusting the baseline proximity capacitance value includes, when a user is indicated as being in proximity to the electronic device, setting the baseline proximity capacitance value equal to the proximity capacitance value minus a proximity capacitance threshold.

9. The electronic device of claim 8, wherein the proximity pad and the first reference pad are included in a single circuit layer.

10. The electronic device of claim 8, wherein the second reference pad and the temperature pad are included in a single circuit layer.

11. The electronic device of claim 8, wherein:
   the sensor arrangement, having the first circuit layer and the second circuit layer stacked, has a top-view footprint shaped like an oval ring;
   the proximity pad occupy much of the oval ring footprint, and the first reference pad shaped as a wedge between portions of the proximity pad; and
   the second reference pad occupy much of the oval ring footprint, and the temperature pad is disposed within a shadow of the first reference pad.

12. The electronic device of claim 8, wherein the controller is to generate a signal indicative of whether a user is in proximity to the electronic device or not based on signals generated by the sensor arrangement.

13. The electronic device of claim 8, wherein the electronic device includes a headphone, and the sensor arrangement is included in the headphone.

14. The electronic device of claim 8, wherein the sensor arrangement includes a flexible printed circuit.

15. The electronic device of claim 8, wherein adjusting the baseline proximity capacitance value based on the temperature capacitance value includes adjusting the baseline proximity capacitance value in response to changes in the temperature capacitance value.

16. The electronic device of claim 8, wherein the sensor arrangement further comprises a dielectric material shaped as a wedge between portions of the second reference pad, and the temperature pad is disposed within the dielectric material.

17. The electronic device of claim 16, wherein adjusting the baseline proximity capacitance value includes, when a user is indicated as not being in proximity to the electronic device, set the baseline proximity capacitance value equal to the proximity capacitance value.

18. A method of proximity detection for an electronic device, comprising:
   adjusting a baseline proximity capacitance value based at least in part on temperature data; and
   determining whether a user is in proximity to the electronic device, wherein determining whether the user is in proximity to the electronic device includes performing a threshold comparison based at least in part on a proximity capacitance value and the baseline proximity capacitance value;
   wherein adjusting the baseline proximity capacitance value is based at least in part on an indicator of whether a user is currently in proximity to the electronic device.

19. The method of claim 18, wherein adjusting the baseline proximity capacitance value based at least in part on temperature data includes:
   identifying a temperature change; and in response to identifying the temperature change, adjusting the baseline proximity capacitance value.

20. The method of claim 18, wherein adjusting the baseline proximity capacitance value includes, when a user is indicated as being in proximity to the electronic device, setting the baseline proximity capacitance value equal to the proximity capacitance value minus a proximity capacitance threshold.

* * * * *